United States Patent [19]
Hiramoto et al.

[11] Patent Number: 5,661,329
[45] Date of Patent: Aug. 26, 1997

[54] SEMICONDUCTOR INTEGRATED CIRCUIT DEVICE INCLUDING AN IMPROVED SEPARATING GROOVE ARRANGEMENT

[75] Inventors: Toshiro Hiramoto, Yokohama; Nobuo Tamba; Masami Usami, both of Ohme; Takahide Ikeda, Tokorosawa; Kazuo Tanaka, Tokyo; Atsuo Watanabe, Hitachioota; Satoru Isomura; Toshiyuki Kikuchi, both of Ohme; Toru Koizumi, Musashimurayama, all of Japan

[73] Assignee: Hitachi, Ltd., Tokyo, Japan

[21] Appl. No.: 350,944

[22] Filed: Dec. 7, 1994

[30]  Foreign Application Priority Data

Dec. 9, 1993 [JP] Japan ............................ 5-308945
Feb. 4, 1994 [JP] Japan ............................ 6-012341

[51] Int. Cl.$^6$ ........................... H01L 29/00; H01L 27/01
[52] U.S. Cl. .................. 257/510; 257/347; 257/506; 257/513; 257/517
[58] Field of Search ........................ 257/510, 512, 257/513, 517, 518, 520, 506, 370, 374, 378, 347, 350, 351

[56]  References Cited

U.S. PATENT DOCUMENTS 5,168,341 12/1992 Kumagai et al. ................ 257/370
5,283,461 2/1994 Beasom ........................... 257/520
5,362,667 11/1994 Linn et al. ...................... 257/347
5,381,033 1/1995 Matsuzaki ....................... 257/510

FOREIGN PATENT DOCUMENTS 2-184068 7/1990 Japan ............................ 257/347

OTHER PUBLICATIONS

Kluwer Academic Publication, "Bi–CMOS Technology and Applications", edited by A. Alvarez, pp. 67–68.

Primary Examiner—Steven H. Loke
Attorney, Agent, or Firm—Antonelli, Terry, Stout & Kraus, LLP

[57]  ABSTRACT

A semiconductor integrated circuit device includes an element separating first and second grooves formed to surround active regions to be formed with a semiconductor element. In addition a third groove is formed to surround at least a portion of the first groove, when viewed from a plane view. In the semiconductor integrated circuit device, the active regions and an element separating region of a silicon layer are insulated from each other by the separating grooves extending from the main surface of the silicon layer to an underlying insulating layer, and are fed with a common fixed potential.

16 Claims, 15 Drawing Sheets

—— FIRST GROOVE
------ SECOND GROOVE

SEMICONDUCTOR INTEGRATED CIRCUIT DEVICE INCLUDING AN IMPROVED SEPARATING GROOVE ARRANGEMENT

BACKGROUND OF THE INVENTION

The present invention relates to a semiconductor integrated circuit device and a process for manufacturing the same and, more particularly, to a technique which is effective if applied to a semiconductor integrated circuit device having its elements separated by a separating groove formed in a semiconductor substrate.

More specifically, the present invention relates to a technique which is effective if applied to the type of semiconductor integrated circuit device in which bipolar transistors and complementary MOSFETs (which will be referred to as the "CMOS") are formed in a silicon single crystal layer laid over an insulating layer and in which the bipolar transistors are surrounded by an insulating separating groove, whereas the NMOS and the PMOS are separated by a separating groove.

In recent years, the bipolar devices or bipolar CMOS devices applied to a fast memory LSI or a fast logic LSI are intended to reduce the parasitic capacity and to improve the degree of integration by separating the elements by a separating groove formed in the semiconductor substrate.

FIG. 12 is a top plan view of an essential portion of a semiconductor substrate and shows a general construction of the bipolar device, and FIG. 13 is a section taken along line B–B' of FIG. 12. Reference numerals 30, 31 and 32 appearing in those Figures designate a p-type semiconductor substrate, an n$^+$-type buried layer and an n-type epitaxial layer.

In the Figures, the bipolar transistor is formed in the region surrounded by a field oxide film 41, with the aforementioned buried layer 31 as its buried type heavily doped collector region, the epitaxial layer 32 as its lightly doped collector region, an n-type semiconductor region 33 as its collector contact region, a p-type semiconductor region 34 as its base region, and an n$^+$-type semiconductor region 35 as its emitter region, and is electrically isolated from an adjoining element by a groove 36 enclosing it. An insulator 40 is buried in the groove 36. The emitter region 35, the base region 34 and the collector contact region 33 are respectively connected with an emitter electrode 37, a base electrode 38 and a collector electrode 39, which are made of Al, for example, through the openings formed in an inter-layer insulating film 42.

In FIG. 6 on pp. 68 of "Bi-CMOS Technology and Applications" of 1989 published by Kluwer Academic Publication and edited by Antonio R. Alvarez, there is disclosed the Bi-CMOS process of forming an n-type buried layer and a p-type buried layer on the surface of a p-type silicon substrate, forming an n-type epitaxial layer on the p-type silicon substrate, and subsequently forming an n-type well region and a p-type well region in the n-type epitaxial layer positioned over the aforementioned n-type buried layer and p-type buried layer. There is another disclosure, in which a thick field insulating film is formed in the boundary between the n-type well region and the p-type well region so that it may be used as an isolation region between the NMOS elements or the PMOS elements.

Moreover, the bipolar transistors are electrically isolated from each other by the separating groove which extends from the surface of the n-type epitaxial layer to separate the n-type buried layer.

In Japanese Patent Laid-Open No. 184068/1990, there is disclosed a process of forming an n-type well region and a p-type well region over a silicon substrate (i.e., Silicon On Insulator substrate, as will be shortly referred to as the "SOI substrate") formed over an insulating layer, subsequently forming an isolation groove between the aforementioned n-type well region and p-type well region, and forming a CMOS over the main surface of each of the n-type well region and the p-type well region isolated by the aforementioned isolation groove.

SUMMARY OF THE INVENTION

In the aforementioned element separating groove 36, there is usually buried a polycrystalline silicon film or an insulator through a thin silicon oxide film. At this time, for the smaller width of the groove 36, the polycrystalline silicon film or the insulator can be made the thinner to improve the flatness of the buried structure. Moreover, the narrower groove 36 increases the effective area of the active region the more to provide the higher advantage in the degree of integration of the device. From these reasons, the device having a designing rule of about 0.5 µm, for example, has the width of the groove 36 set to its minimum working size of about 0.5 µm.

However, the element separating groove 36 has to be made as deep (e.g., about 3 µm or more) as to reach the semiconductor substrate 30 through the epitaxial layer 32 and the buried layer 31 so that it takes an aspect ratio of 6 or more if its width is about 0.5 µm. For the device having a designing rule of about 0.5 µm, moreover, the total length of the groove 36 reaches as far as several or several tens meters for each semiconductor chip.

However, the long groove 36 having such a high aspect ratio is extremely difficult to work with an excellent production yield by the existing dry etching technique. If, at the time of working the groove 36, the semiconductor substrate 30 has its surface blotted with a foreign substance or the groove working photoresist mask is abnormally shaped, the normal groove to reach the semiconductor substrate 30 may fail to be partially formed, as shown in FIG. 14, to cause a working failure 43, thus raising a problem that the semiconductor element cannot be electrically isolated.

In Japanese Patent Application No. 201001/1992 (as filed on Jul. 28, 1992), there is disclosed a semiconductor integrated circuit device having the Bi-CMOS structure, which has been investigated by us in the course of the present invention. This application discloses the elements formed in the SOI substrate, such as the bipolar transistor, the NMOS and the PMOS.

The SOI substrate is composed, from its lower portion, of a p-type silicon single crystal support substrate, a silicon oxide film and an n-type silicon single crystal layer, which is formed all over the surface of the SOI substrate with an n$^+$-type buried layer having the same conduction type as that of the n-type silicon single crystal layer and doped in a higher concentration than that of the n-type silicon single crystal layer.

The above-specified elements are formed in the active region (or the element forming region) which is enclosed by the field insulating film selectively formed over the surface of the SOI substrate. In the field region formed with the field insulating film, there are formed the wiring lines, the external terminals (or bonding pads) and so on.

Between the individual bipolar transistors, moreover, there is formed an insulating separating groove which extends from the surface of the n-type silicon single crystal layer to the silicon oxide film to isolate the individual bipolar transistors electrically.

On the other hand, the NMOS and the PMOS are formed in the p-type well region and the n-type well re,ion which are formed in the n-type silicon single crystal layer. Between the p-type well region and the n-type well region, moreover, there is formed a separating groove which is similar to that formed between the individual bipolar transistors.

Here will be described the results of our investigations of the aforementioned semiconductor integrated circuit device.

The aforementioned separating groove is prepared by the dry etching technique such that a groove is so formed in the field insulating film and the n-type silicon single crystal layer as to reach the silicon single crystal film and is buried with an insulating film such as a silicon oxide film. At the dry etching step, however, there may occur a failure that the groove fails to reach the silicon oxide film by a foreign substance.

The separating groove is formed to enclose the bipolar transistor, for example. If such failure should occur even in a portion around the bipolar transistor, the enclosed bipolar transistor cannot be used. If these unusable transistors increases to a predetermined number or more, the chip becomes defective. In short, the aforementioned failure of the separating groove causes a problem of lowering the production yield.

Therefore, an object of the present invention is to improve the electric reliability of a semiconductor integrated circuit device having its elements separated by a groove.

Another object of the present invention is to provide a technique for enhancing the production yield of a semiconductor integrated circuit device which has a plurality of bipolar transistors formed in a silicon single crystal layer laid over a semiconductor substrate or an insulating layer such that the bipolar transistors are electrically isolated by separating grooves.

The aforementioned and other objects and novel features of the present invention will become apparent from the following description to be made with reference to the accompanying drawings.

A representative of the invention to be disclosed herein will be briefly described in the following.

The semiconductor integrated circuit device of the present invention includes: an element separating first groove formed to surround an active region to be formed with semiconductor elements; and a second groove formed to surround the first groove at least partially.

In the process for manufacturing a semiconductor integrated circuit device of the present invention, moreover, the first groove to thoroughly surround the active region to be formed with the semiconductor elements and the second groove to enclose the first groove at least partially are formed simultaneously with each other.

In the semiconductor integrated circuit device in which an active region (or an element forming region) and a field region are formed in the surface of a silicon single crystal layer laid over an insulating layer and in which bipolar transistors formed in the active region are surrounded by separating grooves, the potential to be applied to the silicon single crystal layer of the field region is set to the highest one of the potentials to be applied to the semiconductor integrated circuit device.

According to the above-specified means, even if the first groove should have a working failure in its portion so that the semiconductor elements inside and outside of the groove cannot be electrically isolated, this electric isolation can be effected by the second groove around the first one thereby to ensure the element isolation by the grooves.

Moreover, the semiconductor integrated circuit device of the present invention constitutes the ECL circuit, for example. In this case, most of the bipolar transistors of the semiconductor integrated circuit device have their collectors fed with the highest one of the potentials to be applied to the semiconductor integrated circuit device.

The present invention notes that fact and equalizes the highest collector potential to be fed to the bipolar transistors and the potential of the field region by setting the potential to be fed to the silicon single crystal layer of the field region to the highest one of the potentials to be fed to the semiconductor integrated circuit device. As a result, even if a failure should occur in the separating groove positioned between the bipolar transistors having their collectors fed with the highest potential and the field region, the bipolar transistor enclosed by the defective separating groove can be used as a normal one. In short, it is possible to enhance the production yield of the semiconductor integrated circuit device.

Since, moreover, the potential to be fed to the silicon single crystal layer of the field region is set to the highest one of the potential to be fed to the semiconductor integrated circuit device, the collector potential of the bipolar transistor to be fed with the highest potential can be equalized to the potential of the field region. As a result, it is possible to omit the separating groove which might otherwise be formed between the bipolar transistor having its collector fed with the highest potential and the field region.

DESCRIPTION OF THE PREFERRED EMBODIMENTS

The present invention will be described in detail in connection with its embodiments with reference to the accompanying drawings.

Embodiment 1

Figure 1:
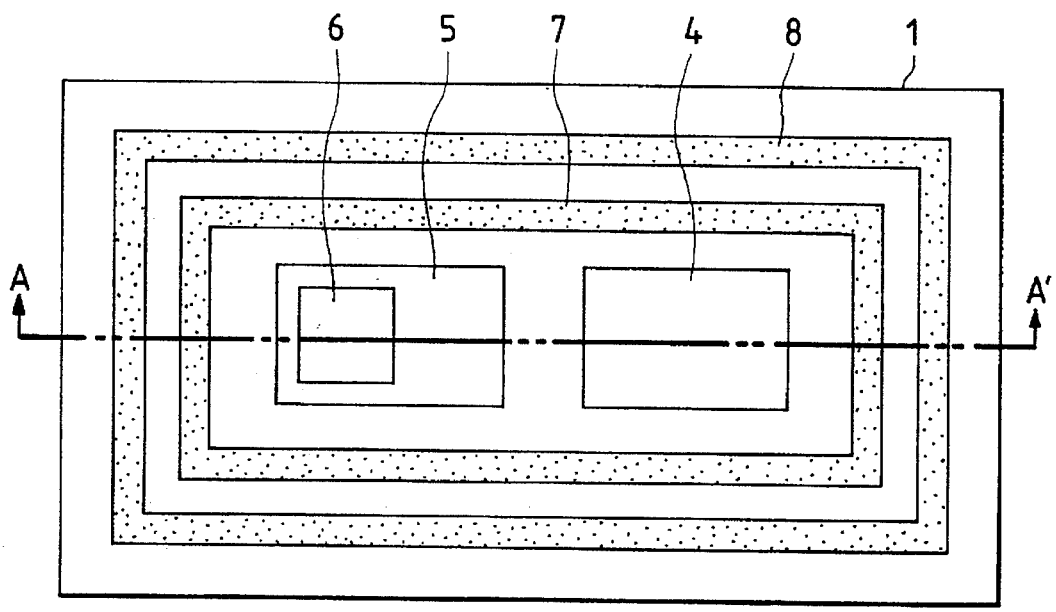
FIG. 1 is a top plan view showing an essential portion of a semiconductor substrate of a semiconductor integrated circuit device according to Embodiment 1 of the present invention.
Figure 2:
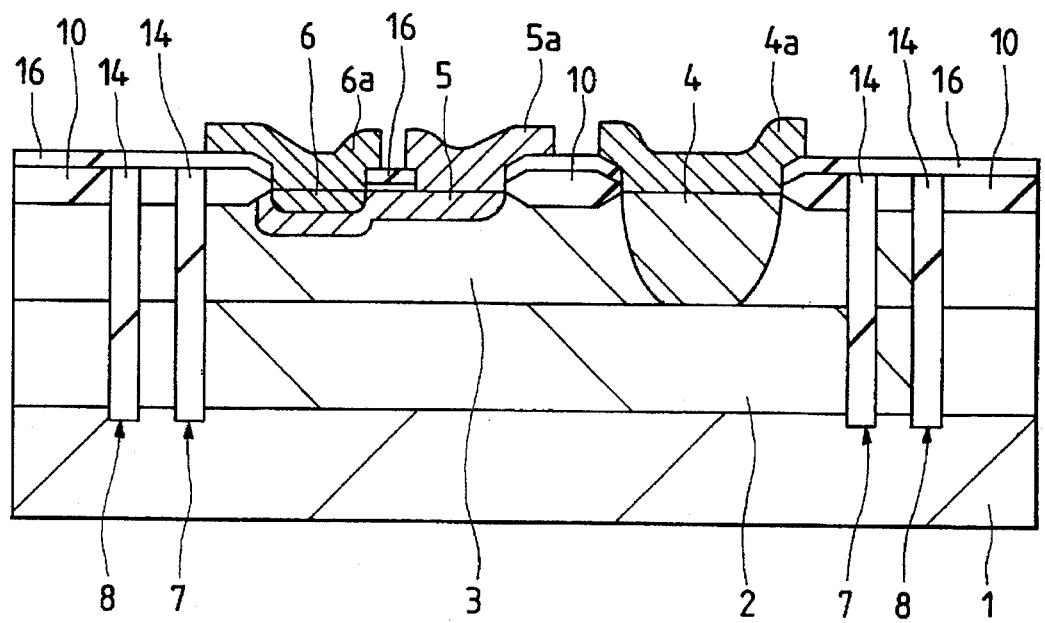
FIG. 2 is a section showing the semiconductor substrate and taken along line A–A' of FIG. 1.

FIG. 1 is a top plan view of an essential portion of a semiconductor substrate and shows the construction of a bipolar device according to one embodiment of the present invention, and FIG. 2 is a section taken along line A–A' of FIG. 1.

Over a semiconductor substrate 1 made of a p-type silicon single crystal, for example, there is formed a buried layer 2 of an n$^+$-type semiconductor region, over which is formed an epitaxial layer 3 made of an n-type silicon single crystal.

In the active region of the aforementioned epitaxial layer 3, there is formed an npn-type bipolar transistor which is formed of: the buried layer 2 as its buried type heavily doped collector region; the epitaxial layer 3 as its lightly doped collector region; an n-type semiconductor region 4 formed over the main surface of the epitaxial layer 3 as its collector contact region; a p-type semiconductor region 5 as its base region; and an n$^+$-type semiconductor region 6 as its emitter region. Moreover: the emitter region 6 is connected with an emitter lead-out electrode 6a made of n$^+$-type polycrystalline silicon; the base region 5 is connected with a base lead-out electrode 5a made of p$^+$-type polycrystalline silicon; and the collector contact region 4 is connected with a collector electrode 4a made of n$^+$-type polycrystalline silicon. These electrodes 6a, 5a and 4a are respectively connected with the emitter region, the base region and the collector contact region through openings formed in an inter-layer insulating film 16.

The bipolar device of the present embodiment is characterized by forming: an element separating first groove 7 to thoroughly surround the active region formed with the aforementioned bipolar transistor: and an element separating second groove 8 to surround the first groove.

In the present embodiment, as shown in FIG. 1, the second groove 8 outside of the first groove 7 is formed to thoroughly surround the first groove but should note limited to this layout. The second groove 8 may be formed to enclose at least a portion of the first groove 7. Both of these first and second grooves 7 and 8 are made as deep as to reach the semiconductor substrate 1 through the epitaxial layer 3 and the buried layer 2 and are given a depth of about 3.5 μm from the surfaces to the bottoms and a width of about 0.5 μm. Moreover, the first groove 7 and the second groove 8 are spaced at a distance of about 0.6 μm.

Figure 3:
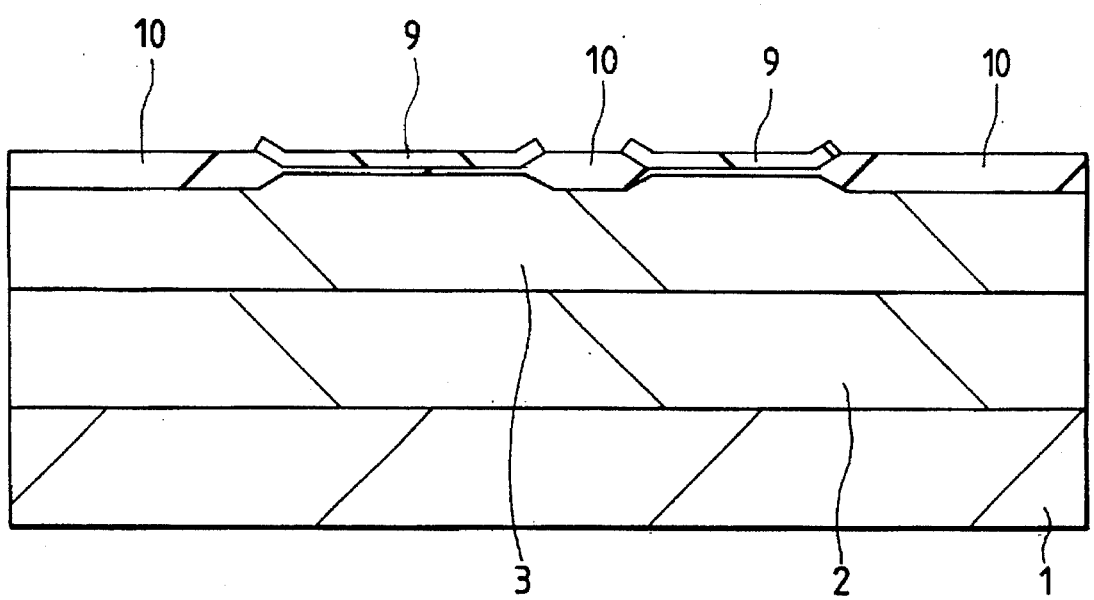
FIGS. 3 to 8 are sections of an essential portion of the semiconductor substrate and showing the method of manufacturing the semiconductor integrated circuit device shown in FIGS. 1 and 2, sequentially in the order of steps.

The first and second grooves 7 and 8 thus constructed are formed in the following manner. As shown in FIG. 3, first of all, the p-type semiconductor substrate 1 is doped by the ion implantation with an n-type impurity (e.g., Sb) of $10^{19}/cm^2$ to form the n$^+$-type buried layer 2. Subsequently, the substrate 1 including the buried layer 2 is doped with an n-type impurity of about $10^{15}/cm^2$ to form thereover the epitaxial layer 3 having a thickness of about 1 μm. After this, the epitaxial layer 3 is formed over its main surface with a field insulating film (or a silicon oxide film) 10 having a thickness of about 0.5 μm, by the selective oxidation using a silicon nitride film 9 as a non-oxidizable mask.

Figure 4:
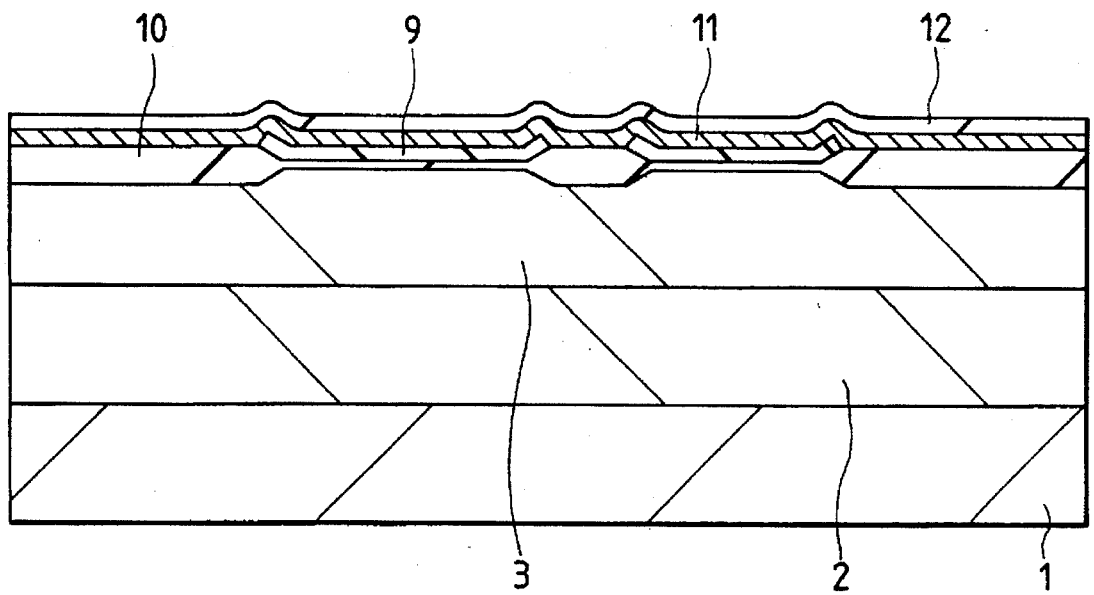
Figure 5:
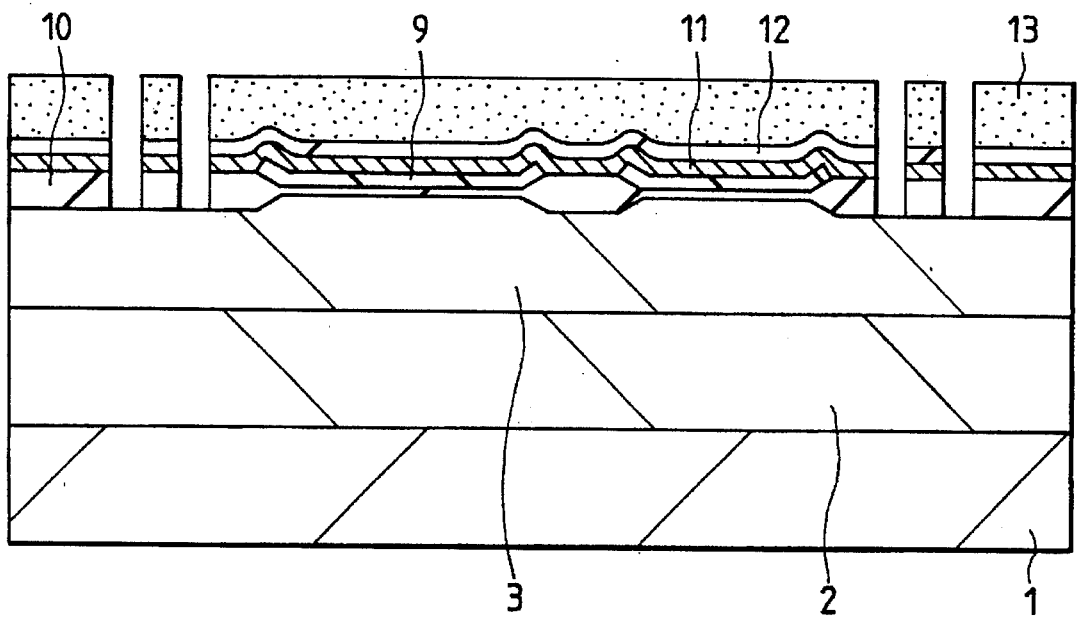

Next, as shown in FIG. 4, a polycrystalline silicon film 11 and a silicon oxide film 12 each having a thickness of about 0.2 μm are sequentially deposited on the whole surface of the semiconductor substrate 1 by the CVD method. After this, as shown in FIG. 5, a photoresist 13 is used as the mask to sequentially etch the silicon oxide film 12, the polycrystalline silicon film 11 and the silicon oxide film 10 in the field region by the anisotropic etching such as the RIE (i.e, Reactive Ion Etching).

Figure 6:
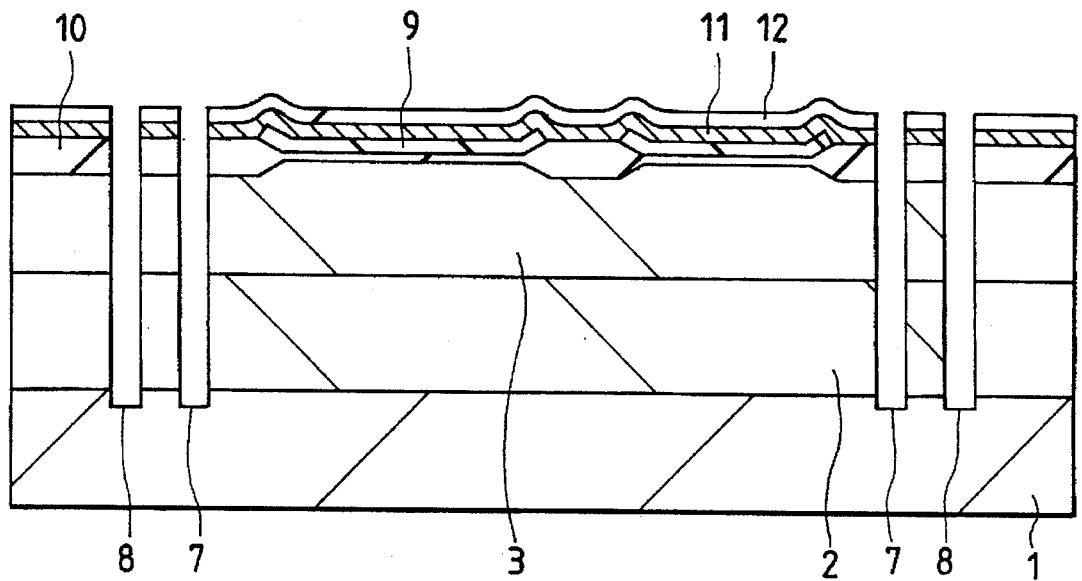

Next, the photoresist 13 is removed. After this, as shown in FIG. 6, the silicon oxide film 12 is used as the mask to sequentially etch the epitaxial layer 3 and the buried layer 2 in the field region by the RIE to form the first groove and the second groove 8 simultaneously as deep as to reach the semiconductor substrate 1.

Figure 7:
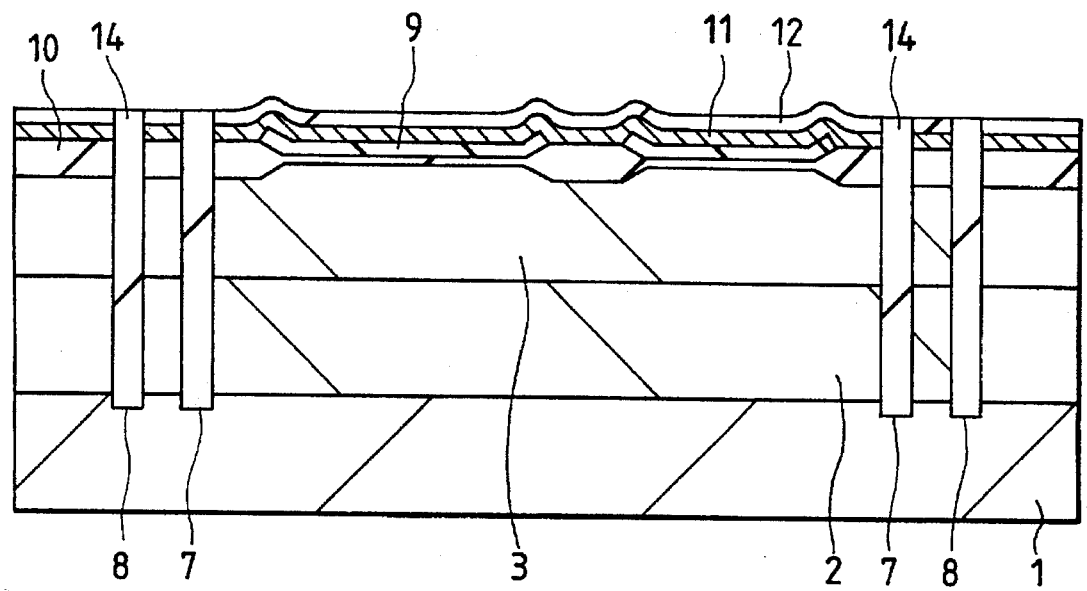

Next, the silicon oxide film is deposited by the CVD method all over the semiconductor substrate 1 including the insides of the first and second grooves. After this, the etch-back is carried out as thick as the deposited silicon oxide film to bury the first groove 7 and the second groove 8 with a silicon oxide film 14, as shown in FIG. 7. After this, this silicon oxide film 14 is over-etched off except from the inside of the grooves 7 and 8. At this time, the polycrystalline silicon film 11 functions as an over etching stopper.

Figure 8:
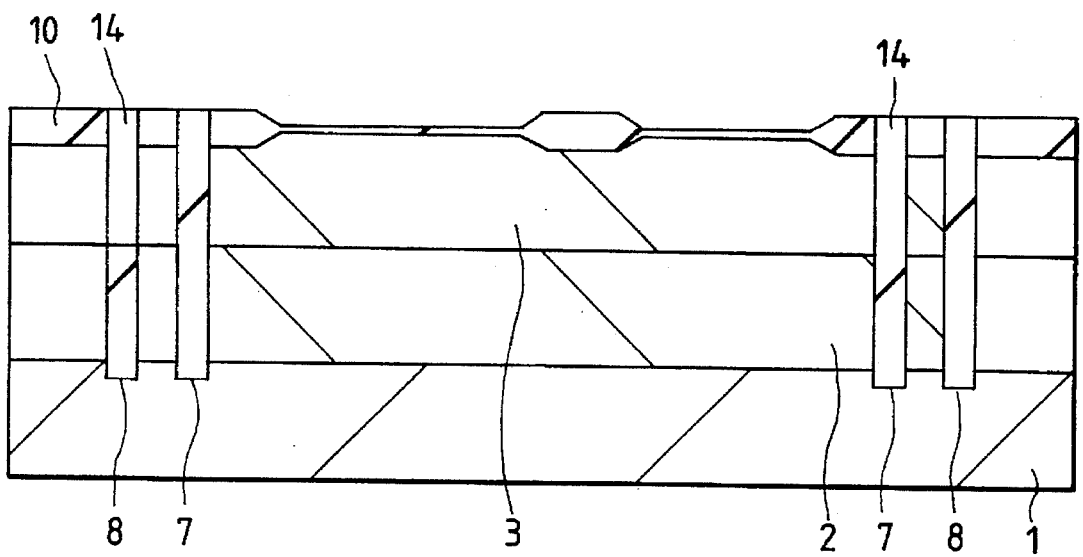

Next, as shown in FIG. 8, the polycrystalline silicon film 11 and the silicon nitride film 9 are etched off. After this, the aforementioned bipolar transistor shown in FIGS. 1 and 2 is formed by the ordinary ion implanting or thin film forming technique in the active region enclosed by the grooves 7 and 8.

Figure 9:
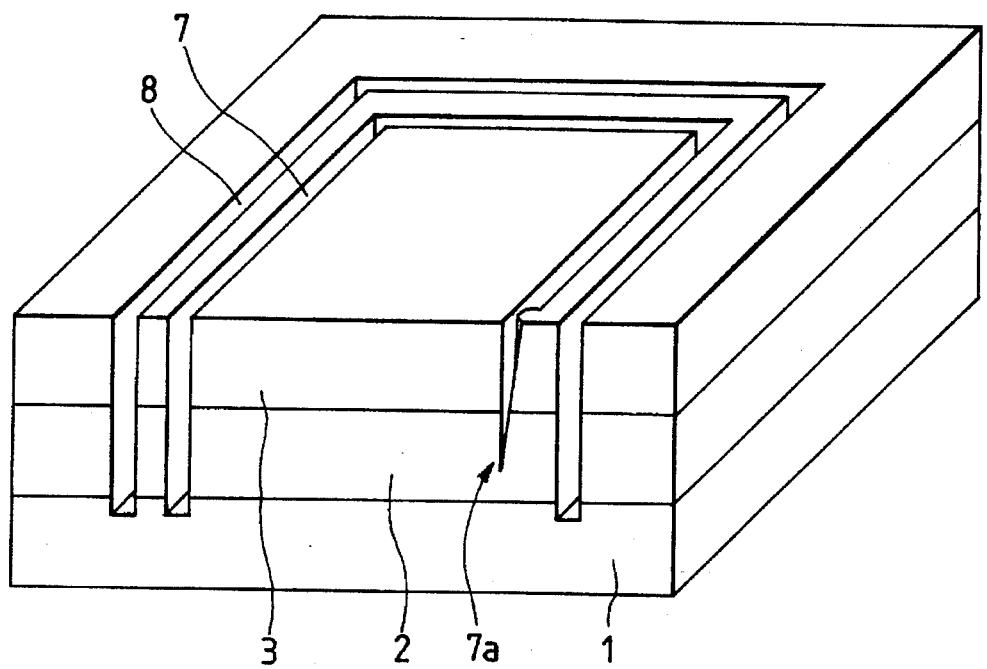
FIG. 9 is a perspective view of the semiconductor substrate and shows the working failures of grooves schematically in the present invention.

Thus, in the present embodiment, the first groove 7 is formed to enclosed the active region formed with the bipolar transistor, and the second groove 8 is formed around the first groove 7. Even if, therefore, the first groove 7 should have a working failure 7a in its portion to break the electric separation between the bipolar transistor enclosed by the groove 7 and the (not-shown) adjoining bipolar transistor outside of the groove 7, as shown in FIG. 9, the electric isolation between those bipolar transistors can be ensured by the second groove 8 formed around the first groove.

Since, moreover, the present embodiment has its first and second grooves 7 and 8 formed in the field region between one active region and its adjoining active region, these active regions will not have their effective area reduced to make no obstruction against the high integration of the bipolar device.

Since, moreover, the first groove 7 and the second groove 8 are simultaneously formed at the same step in the present embodiment, no step of manufacturing the bipolar device increases.

Embodiment 2

Figure 10:
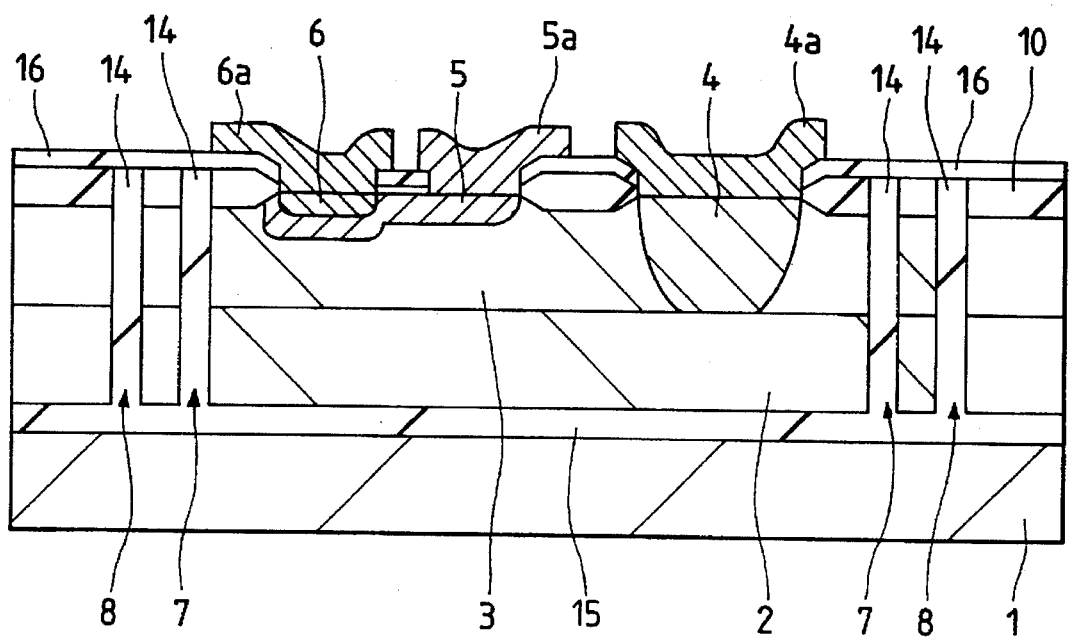
FIG. 10 is a section showing an essential portion of a semiconductor substrate of a semiconductor integrated circuit device according to Embodiment 2 of the present invention.

As shown in FIG. 10, a bipolar device of the present embodiment is formed over an SOI substrate which is formed with an insulating film 15 between the semiconductor substrate 1 and the buried layer 2. The manufacture of this SOI substrate is exemplified by the following method. A silicon oxide film having a thickness of about 0.5 to 1.0 μm is formed by the thermal oxidation over the surface of the semiconductor substrate 1 made of a silicon single oxide having a thickness of about 500 μm, to form the insulating film 15. Next, a not-shown semiconductor substrate is laid over the insulating film 15, and these two are adhered by the heat treatment. After this, the second semiconductor substrate is polished to a thin film having a thickness of about 1 to 2 μm. Next, this thinned second semiconductor substrate is doped with an n-type impurity to form the buried layer 2. The epitaxial layer 3 is formed over the buried layer 2.

The bipolar device of the present embodiment is characterized by forming the element separating first groove 7 to thoroughly surround the active region to be formed with the bipolar transistor, and by forming the element separating second groove 8 to enclosure the groove 7, so that a complete dielectric isolation may be effected by the grooves 7 and 8 which are as deep as to reach the insulating film 15 through the epitaxial layer 3 and the buried layer 2. The method of forming the grooves 7 and 8 is not repeated because it is identical to that of the foregoing Embodiment 1.

According to the present embodiment, the active region to be formed with the bipolar transistor can be completely isolated in an electric manner from its surrounding so that the parasitic capacity can be reliably reduced to realize a fast bipolar device.

In the foregoing Embodiments 1 and 2, the second groove is formed to enclose the first groove thoroughly, but its arrangement should not be limited thereto.

Figure 11:
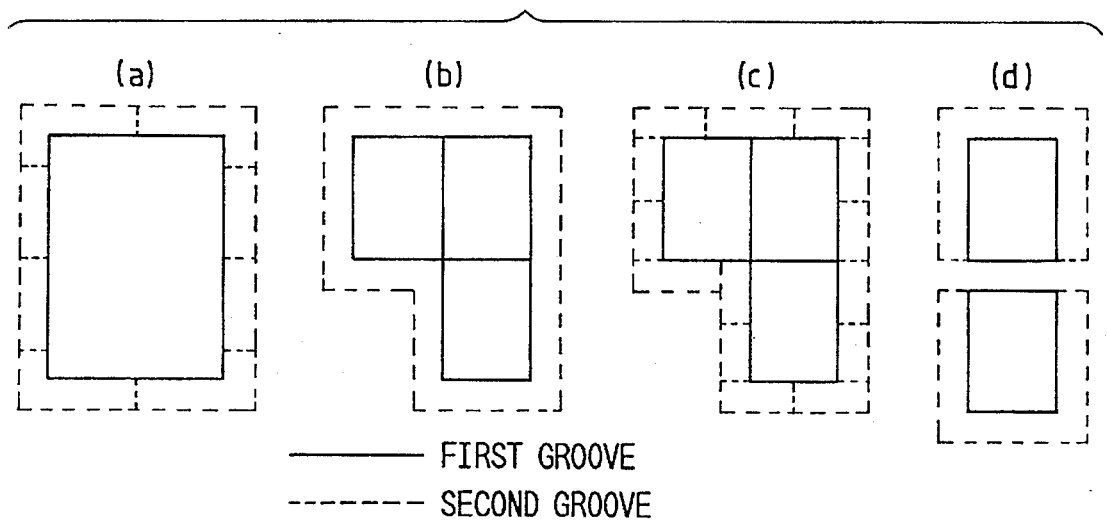
FIGS. 11(a) to 11(d) are top plan views showing an essential portion of a semiconductor substrate of a semiconductor integrated circuit device according to modifications of Embodiments 1 and 2 of the present invention.
Figure 12:
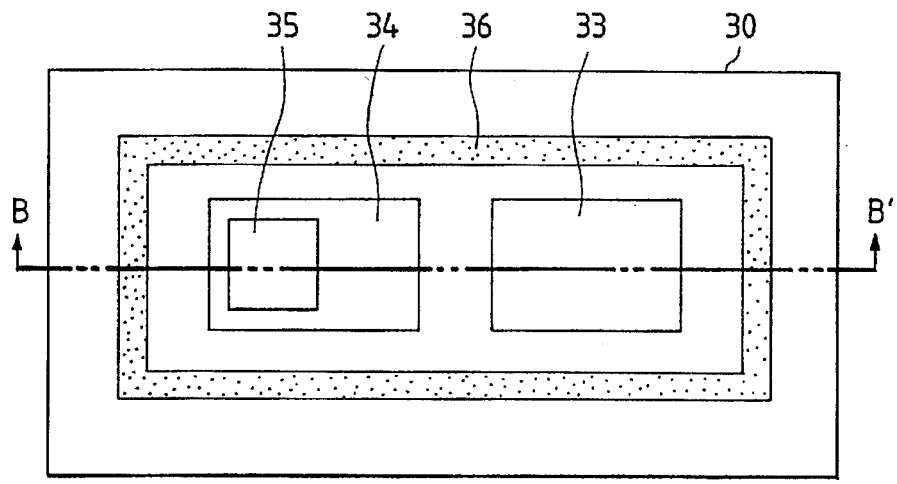
FIG. 12 is a top plan view showing an essential portion of a semiconductor substrate of the semiconductor integrated circuit device of the prior art using grooves for isolating the elements.
Figure 13:
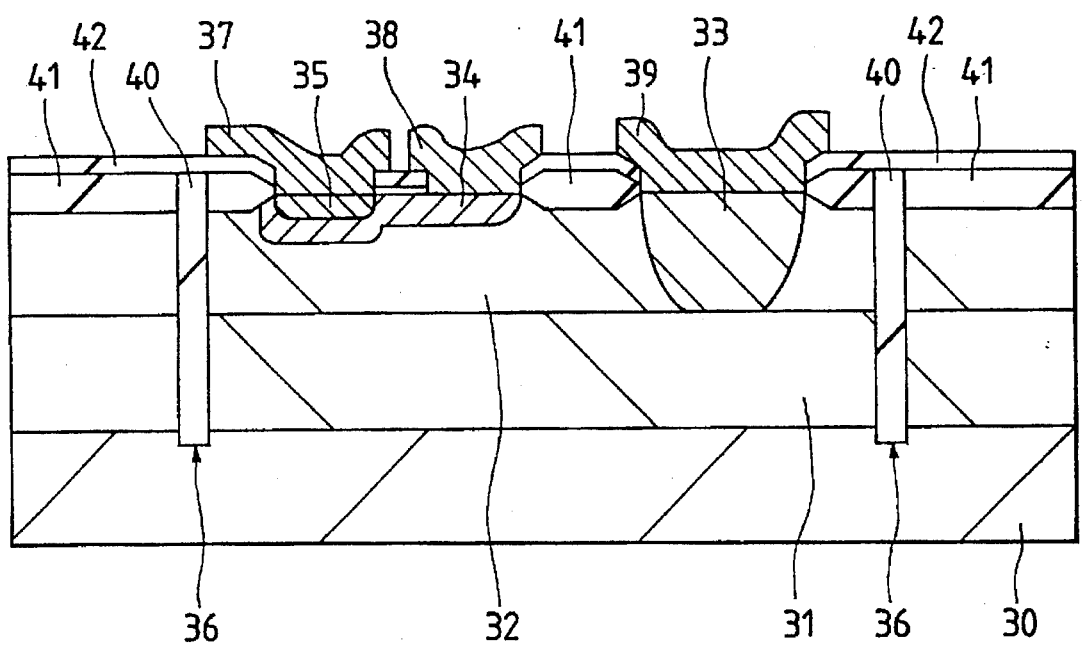
FIG. 13 is a section showing the semiconductor substrate and taken along line B–B' of FIG. 12.
Figure 14:
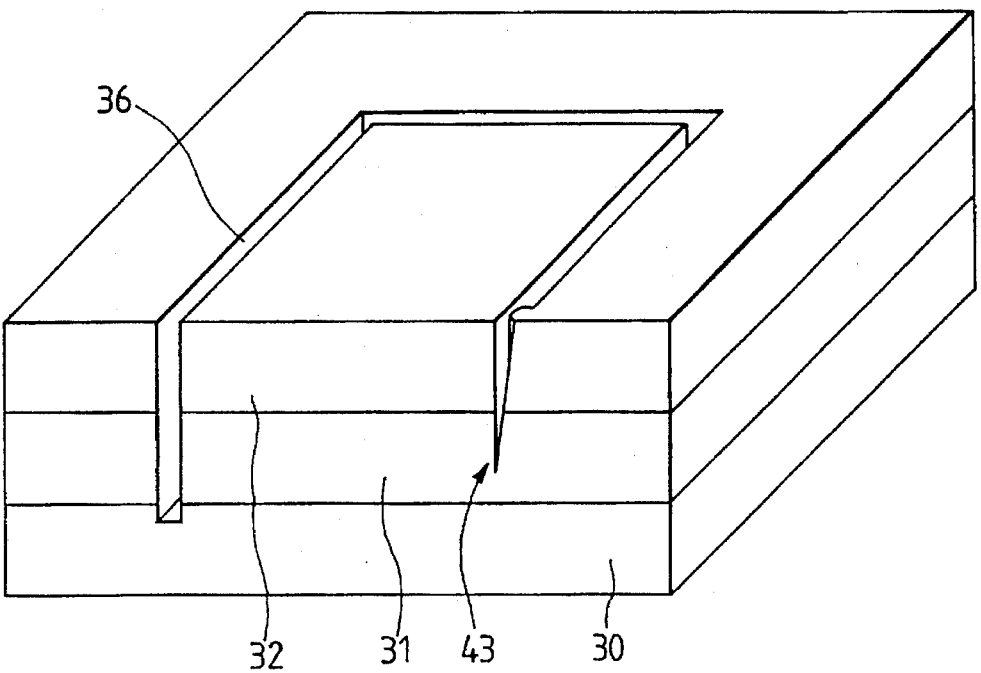
FIG. 14 is a perspective view of an essential portion showing the working failures of the isolating grooves in the semiconductor integrated circuit device which has been examined at the stage of conceiving the present invention.

For example, FIG. 11(a) is a top plan view showing an embodiment, in which the second groove 8 enclosing the first groove 7 is divided into a plurality of small blocks. According to this construction, the parasitic capacity can have its increase minimized because the areas of the regions surrounded by the grooves 7 and 8 are small, even if the first groove 7 should have a working failure in its portion so that the buried layer takes conduction between the inside and outside of the groove 7.

On the other hand, FIG. 11(b) presents an embodiment, in which the second groove 8 enclosing the grooves 7 is formed not for each active region (i.e., each bipolar transistor) but for a plurality of (e.g., three) active regions. According to this embodiment, the working failure to occur in the grooves 7 at the boundaries between the two adjoining active regions cannot be relieved, but a partial relief can be given by enclosing all the active regions by the groove 8. Alternatively, as shown in FIG. 11(c), the increase in the parasitic capacity can be minimized by dividing the second groove 8 into a plurality of small blocks.

FIG. 11(d) presents another embodiment, in which the second grooves 8 are partially formed to enclose the grooves 7 because the field region between the two active regions is so narrow that it cannot be formed with the second groove 8. Thus, the second groove 8 may be formed to enclose at least a portion of the first groove 7 and need not be formed to enclose the groove 7 thoroughly.

Although the foregoing embodiments have been described in case the active regions are formed with the bipolar transistors, the present invention should not be limited thereto but can be applied to the case in which the active region is formed with a variety of semiconductor elements including MISFETs.

Although the foregoing Embodiments 1 and 2 have been described in case the silicon oxide film is buried in the first and second grooves, the present invention should be limited thereto, but a polycrystalline silicon film may be buried in the grooves after these grooves have been formed thereon with a thin oxide film.

Thus, the element separating first groove is formed to surround the active region to be formed with the semiconductor element, and the second groove is formed to surround at least a portion of the first groove. Even if the first groove should have a working failure in its portion to break an electric isolation between the semiconductor element enclosed by the first groove and the semiconductor element outside of the first groove, this breakage of electric isolation can be prevented by the second groove formed around the first groove. As a result, the electric isolation by the grooves can be ensured to improve the reliability and the production yield of the semiconductor integrated circuit device which is formed with the grooves for the element separations.

Embodiment 3

Figure 15:
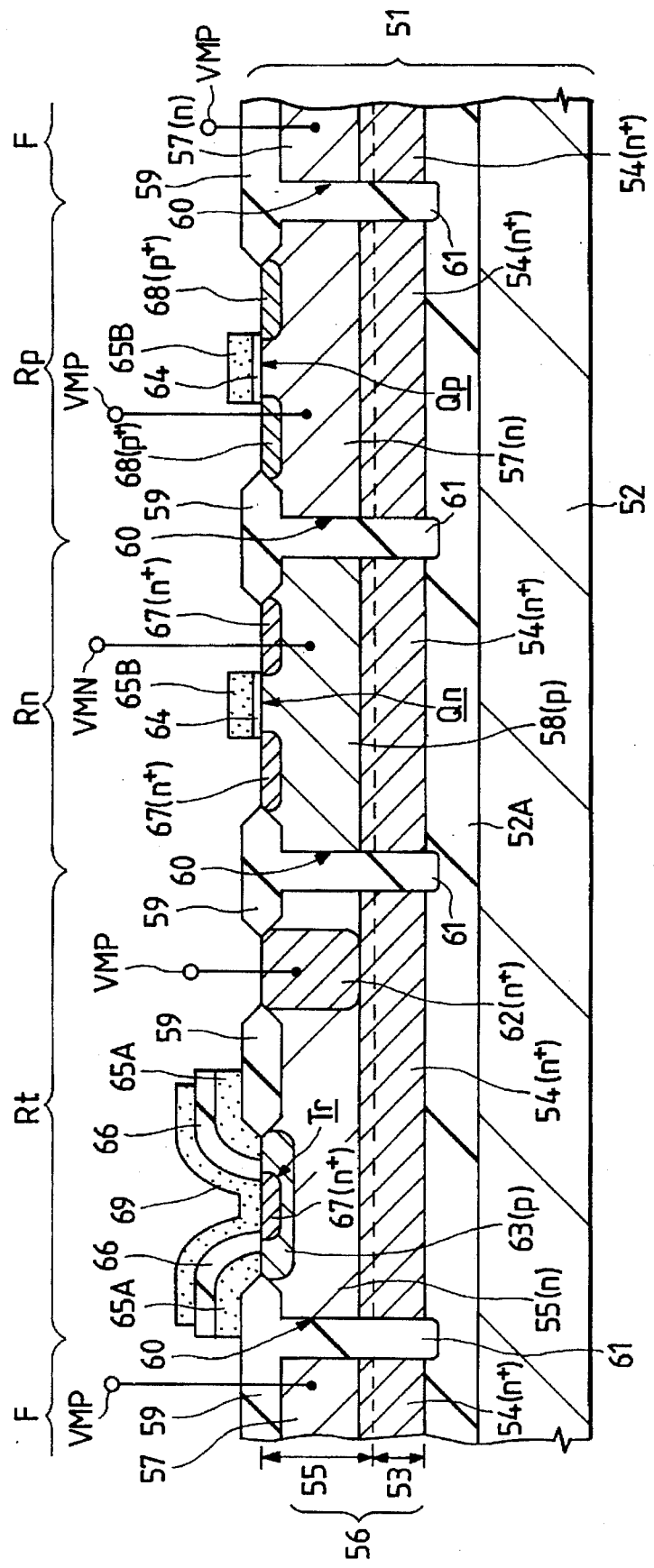
FIG. 15 is a section showing an essential portion of a semiconductor substrate of a semiconductor integrated circuit device according to Embodiment 3 of the present invention.

A schematic construction of the semiconductor integrated circuit device according to Embodiment 3 of the present invention is shown in FIG. 15 (presenting a section of an essential portion).

As shown in FIG. 15, the semiconductor integrated circuit device is formed over the main surface of a semiconductor substrate 51. This semiconductor substrate 51 is constructed, for example, to have the so-called "SOI (i.e., Silicon On Insulator) structure", in which an n-type silicon single crystal layer 56 is laid over the main surface of a support substrate 52 through an insulating layer 52A. The support substrate 52 is formed of a p$^-$-type semiconductor substrate of a silicon single crystal, for example. The insulating layer 52A is formed of a silicon oxide film, for example. This silicon oxide film is formed by thermally oxidizing the support substrate 52. The n-type silicon single crystal layer 56 is formed, for example, of a two-layered structure by laminating a semiconductor substrate 53 and an n$^-$-type epitaxial layer 55 sequentially on the main surface of the insulating layer 52A. The semiconductor substrate 53 is formed of a silicon single crystal substrate, for example, and is adhered by a heat treatment to the main surface of the insulating layer 52A. The n$^-$-type epitaxial layer 55 is formed by growing it on the main surface of the semiconductor substrate 53.

In the semiconductor substrate 51 described above, the n-type silicon single crystal layer 56 is formed over its main surface with a field insulating film 59. This field insulating film 59 is formed over the main surface of the n-type silicon single crystal layer 56, for example, by the selective thermal oxidation. The active region (i.e., the region to be formed with the elements) defined by the field insulating film 59 is formed with an npn type bipolar transistor Tr, an n-channel MISFET Qn and a p-channel MISFET Qp. A field region F, in which the field insulating film 59 is formed over the main surface of the n-type silicon single crystal layer 56, is formed with wiring lines, external terminals (or bonding pads) and so on.

The aforementioned npn type bipolar transistor Tr is formed in a bipolar transistor forming region Rt. This npn type bipolar transistor Tr is constructed of a vertical structure, in which an n-type emitter region, a p-type base region and an n-type collector region are sequentially arrayed depthwise from the main surface of the n-type silicon single crystal layer 56.

The aforementioned n-type collector region includes an intrinsic collector region, a heavily doped collector region and a collector contact region, of which: the collector contact region is made of an $n^+$-type semiconductor region 62; the intrinsic collector region is made of the $n^-$-type epitaxial layer 55; and the heavily doped collector region is made of an $n^+$-type buried layer 54. This $n^+$-type buried layer 54 is formed all over the surface of the semiconductor substrate 53. The $n^+$-type semiconductor region 62 of the collector control region is formed over the main surface of the $n^-$-type epitaxial layer 55. The $n^+$-type semiconductor region 62 has its bottom portion connected in electric contact with the $n^+$-type buried layer 54.

A collector potential is applied to the $n^+$-type semiconductor region 62 of the collector contact region, i.e., the aforementioned n-type collector region. The semiconductor integrated circuit device of the present embodiment constitutes the ECL circuit. About 40 to 50% of the bipolar transistors existing in the semiconductor integrated circuit device have their collector potential set to the highest fixed potential VMP (e.g., 0 [V]) of the supply voltages fed from the outside. The remaining bipolar transistors Tr are fed with different collector potentials in dependence upon the circuit constructions.

The aforementioned p-type region is made of a p-type semiconductor region 63. This p-type semiconductor region 63 is formed over the main surface of the $n^-$-type epitaxial layer 55. With the p-type semiconductor region 63, there is electrically connected a base lead-out electrode 65A. This base lead-out electrode 65A is formed, for example, of a polycrystalline silicon film which is doped with a p-type impurity (e.g., boron) for reducing the resistance.

The aforementioned n-type emitter region is made of an $n^+$-type semiconductor region 67. This $n^+$-type semiconductor region 67 is formed over the main surface of the p-type semiconductor region 63. With the $n^+$-type semiconductor region 67, there is electrically connected an emitter lead-out electrode 69. This emitter lead-out electrode 69 is formed, for example, of a polycrystalline silicon film which is doped with an n-type impurity (e.g., arsenic or antimony) for reducing the resistance. The emitter lead-out electrode 69 is electrically isolated by an insulating film 66.

The aforementioned n-channel MISFET Qn is formed in an NMOS forming region Rn. This NMOS forming region Rn has its epitaxial layer 55 formed with a p-type well region 58 to be used as the channel forming region of the n-channel MISFET Qn. In short, the n-channel MISFET Qn is formed of: the p-type well region (or channel forming region) 58, a gate insulating film 64, a gate electrode 65B, and a pair of $n^+$-type semiconductor regions 67 for the source region and the drain region. The gate insulating film 64 is made of a silicon oxide film, for example. The gate electrode 65B is made of a polycrystalline silicon film which is doped, for example, with an impurity (e.g., phosphor) for reducing the resistance.

The aforementioned NMOS forming region Rn is defined by a separating groove 60 extending from the main surface of the n-type silicon single crystal layer 56 to the insulating layer 52A, so that it is insulated from the bipolar transistor forming region Rt for forming the npn-type bipolar transistor Tr. In the separating groove 60, there is buried an insulator (or a silicon oxide film) 61, for example. The material for burying the separating groove 60 may be polycrystalline silicon. In this case, the surface of the silicon layer to be exposed in the separating groove may be oxidized in advance to form the silicon oxide film.

In the aforementioned NMOS forming region Rn, there is formed below the p-type well region 58 the $n^+$-type buried layer 54 which is formed in the semiconductor substrate 53 of the n-type silicon single crystal layer 56. The $n^+$-type buried layer 54 is held in contact with the p-type well region 58 and is formed at the same step as that of forming the $n^+$-type buried layer 54 formed in the bipolar transistor forming region Rt. The p-type well region 58 is set, for example, to the lowest fixed potential VMN (e.g., -5.2 [V]) of the external supply voltages. The potential to be applied to the $n^+$-type buried layer 54 below the n-channel MISFET Qn may be floating but is desirably set to the highest fixed potential (e.g., 0 [V]).

The aforementioned p-channel MISFET Qp is formed in a PMOS forming region Rp. This PMOS forming region Rp has its epitaxial layer 55 formed with an n-type well region 57 to be used as the channel forming region of the p-channel MISFET Qp. In short, the p-channel MISFET Qp is composed of the n-type well region (or channel forming region) 57, the gate insulating film 64, the gate electrode 65B, and the pair of $p^+$-type semiconductor regions 68 for the source region and the drain region.

The aforementioned PMOS forming region Rp is defined by the separating groove 60 extending from the main surface of the n-type silicon single crystal layer 56 to the insulating layer 52A and is isolated from the NMOS forming region Rn for forming the n-channel MISFET Qn and the field region F.

In the PMOS forming region Rp, there is formed below the n-type well region 57 the $n^+$-type buried layer 54 which is formed in the semiconductor substrate 53 of the n-type polycrystalline silicon layer 56. The $n^+$-type buried layer 54 is held in contact with the n-type well region 57 and is formed at the same state as that of forming the $n^+$-type buried layer 54 formed in the NMOS forming region Rn. The n-type well region 57 is set, for example, to the highest fixed potential VMP (e.g., 0 [V]) of the external supply voltages.

In the aforementioned field region F, the n-type polycrystal line silicon layer 56 has its epitaxial layer 55 formed with the n-type well region 57, and the semiconductor substrate 53 is formed with the $n^+$-type buried layer 54. This $n^+$-type buried layer 54 is held in contact with the n-type well region 57 and is formed at the same step as that of forming the $n^+$-type buried layer 54 formed in the PMOS forming region Rp. In short, the $n^+$-type buried layer 54 is formed all over the semiconductor substrate 3. The field region F is set, for example, to the highest fixed potential (e.g., 0 [V]) of the external supply voltages.

The aforementioned bipolar transistor forming region Rt is defined by the separating region 60 extending from the main surface of the n-type silicon single crystal layer 56 to the insulating layer 52A and is insulated from the NMOS forming region Rn for forming the n-channel MISFET Qn and the field region F.

In the semiconductor integrated circuit device thus constructed, the n-type silicon single crystal layer 56 has its bipolar transistor forming region Rt and field region F set to the equal fixed potential. As a result, the leakage current can be prevented from being established between the region Rt and the field region F, even if the isolation failure for the separating groove 60 to fail to reach the insulating layer 52A should occur at the step of forming the separating groove 60.

Figure 16:
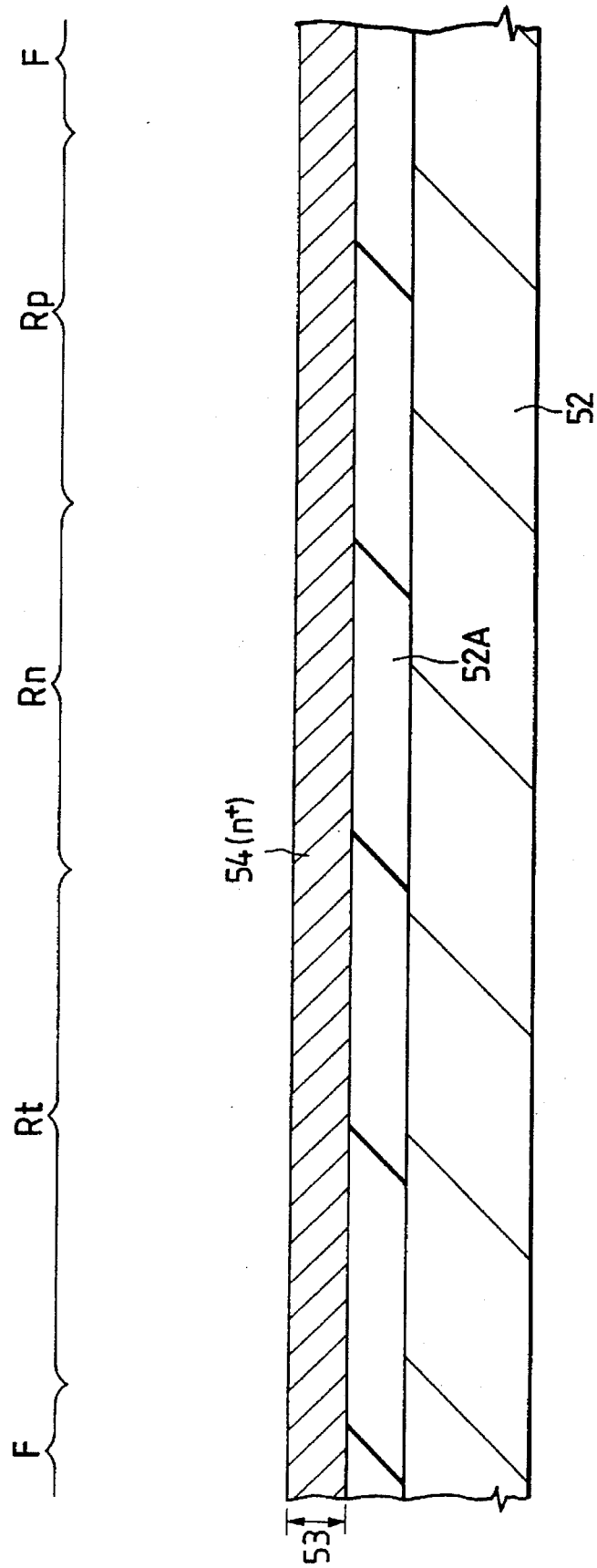
FIGS. 16 to 18 are sections of an essential portion of the semiconductor substrate and showing the method of manufacturing the semiconductor integrated circuit device shown in FIG. 15, sequentially in the order of steps.

Next, the process for manufacturing the aforementioned semiconductor integrated circuit device will be briefly described with reference to FIGS. 16 to 18 (presenting sections of an essential portion at the individual manufacturing steps).

First of all, the support substrate 52 is prepared and formed with the insulating layer 52A over its main surface.

Next, the semiconductor substrate 53 is laid over the main surface of the insulating layer 52A. The semiconductor substrate 53 is adhered to the insulating layer 52A by the heat treatment. After this, the semiconductor substrate 53 has its upper face etched by the polishing treatment to have its thickness reduced.

Next, the semiconductor substrate 53 thus thinned is doped all over its main surface with an n-type impurity by the ion implantation, for example. After this, the semiconductor substrate 53 is thermally diffused to form the n$^+$-type buried layer 54 in the whole region of the semiconductor substrate 53, as shown in FIG. 16.

Figure 17:
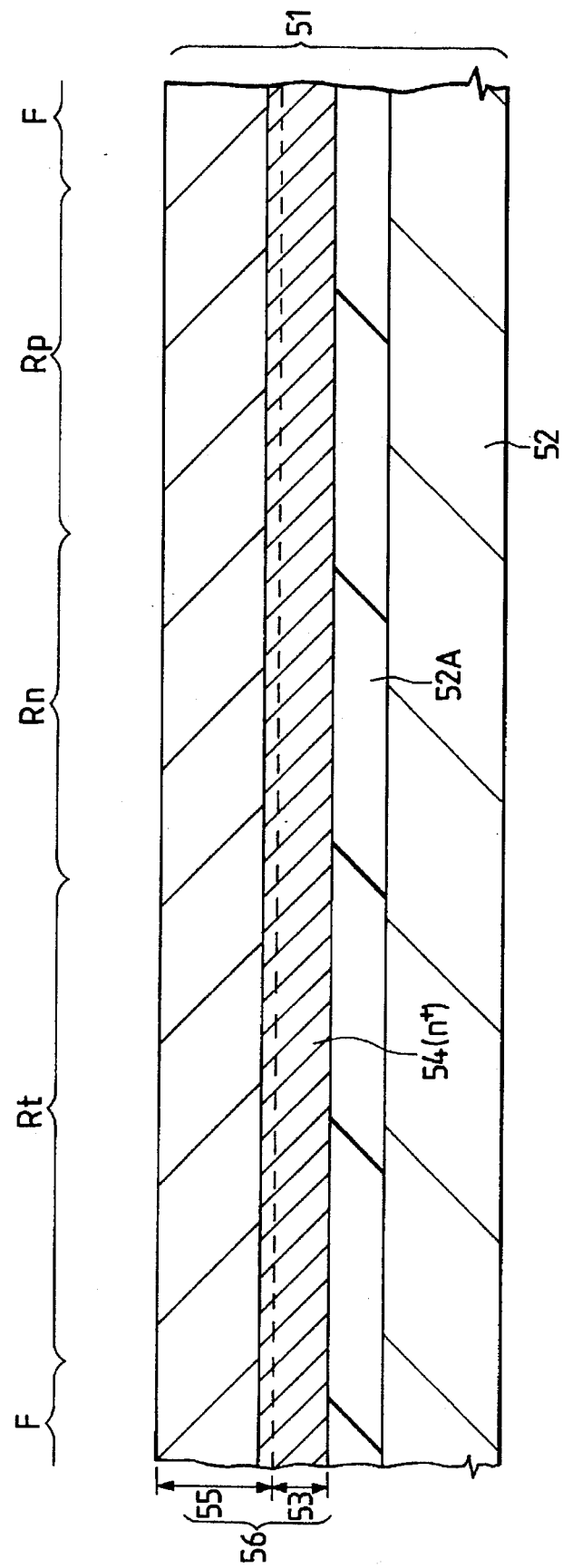

Next, the n$^-$-type epitaxial layer 55 is grown by the epitaxial growth all over the surface of the aforementioned n$^+$-type buried layer 54, as shown in FIG. 17. The n$^-$-type epitaxial layer 55 is formed to have a film thickness of about 0.7 [m], for example. At this step, the n$^+$-type buried layer 54 has its n-type impurity slightly diffused into the n$^-$-type epitaxial layer 55. As a result, there is completed the semiconductor substrate 51 of the SOI structure, in which the n-type silicon single crystal layer 56 having a multi-layered structure composed of the semiconductor substrate 53 and the n$^-$-type epitaxial layer 55 is laid over the main surface of the insulating layer 52A.

Next, the field insulating film 59 is formed by thermally oxidizing the main surface of the aforementioned n-type silicon single crystal layer 56 in a selective manner. The field insulating film 59 is formed to enclose the regions Rt, Rn and Rp.

Next, the separating groove 60 extending from the main surface of the aforementioned n-type silicon layer 56 to the insulating layer 52A through the field insulating film 59 is formed to define the field region F, the bipolar transistor forming region Rt, the NMOS forming region Rn and the PMOS forming region Rp. The separating groove 60 is formed by the anisotropic etching such as the RIE, for example.

Next, there is buried in the aforementioned separating groove 60 the insulator 61. This insulator 61 is formed, for example, by depositing a silicon oxide film all over the main surface of the n-type silicon single crystal layer 56 by the CVD method and by etching back the whole surface of the silicon oxide film.

Next, the PMOS forming region Rp and the field region F of the aforementioned n-type silicon single crystal layer 56 have their individual main surfaces selectively doped with an n-type impurity (e.g., phosphor), for example, by the ion implantation.

Next, the NMOS forming region Rn of the aforementioned n-type silicon single crystal layer 56 has its main surface selectively doped with a p-type impurity (e.g., boron), for example, by the ion implantation.

Figure 18:
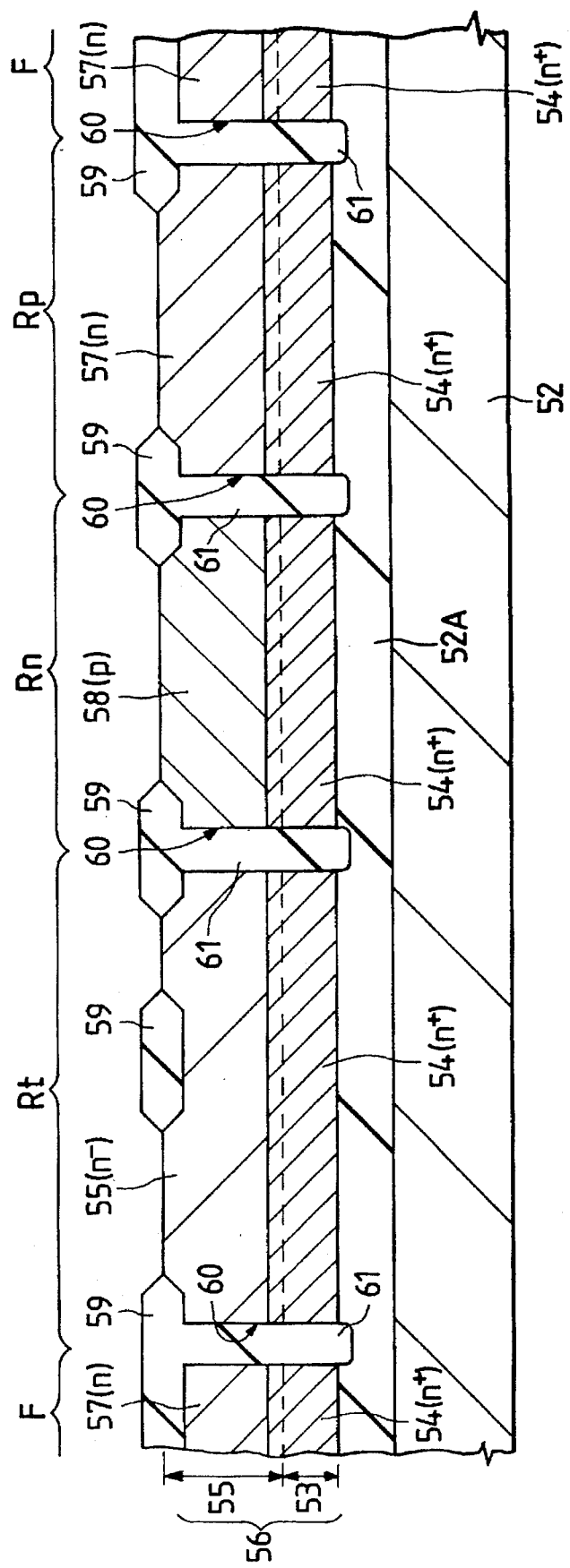

Next, a thermal diffusion is carried out to form the n-type well region 57 in the epitaxial layer 55 of the field region F, the p-type well region 58 in the epitaxial layer 55 of the NMOS forming region Rn, and the n-type well region 57 in the epitaxial layer 55 of the PMOS forming region Rp, individually, as shown in FIG. 18.

Next, the aforementioned n-type silicon single crystal layer 56 has its forming regions Rt, Rn and Rp individually formed with the npn type bipolar transistor Tr, the n-channel MISFET Qn and the p-channel MISFET Qp, thus substantially completing the semiconductor integrated circuit device of the present embodiment, as shown in FIG. 15.

Thus, in the semiconductor integrated circuit device in which the forming region Rt and the field region F of the n-type silicon single crystal layer 56 laid over the insulating layer 52A are insulated from each other by the separating groove 60 extending from the main surface of the n-type silicon single crystal layer 56 to the insulating layer 52A, the forming region Rt and the field region F are individually set to the common fixed potential VMP. Thanks to this construction, the forming region Rt and the field region F are set to the common fixed potential VMP. Even if, in the manufacture process, the separating groove 60 for insulating the forming region Rt and the field region F should fail to reach the insulating layer 52A, the leakage current can be prevented from flowing between the forming region Rt and the field region F. As a result, even the bipolar transistor enclosed by the defective separating groove 60 can be used as normal one to enhance the production yield of the semiconductor integrated circuit device.

Embodiment 4

Figure 19:
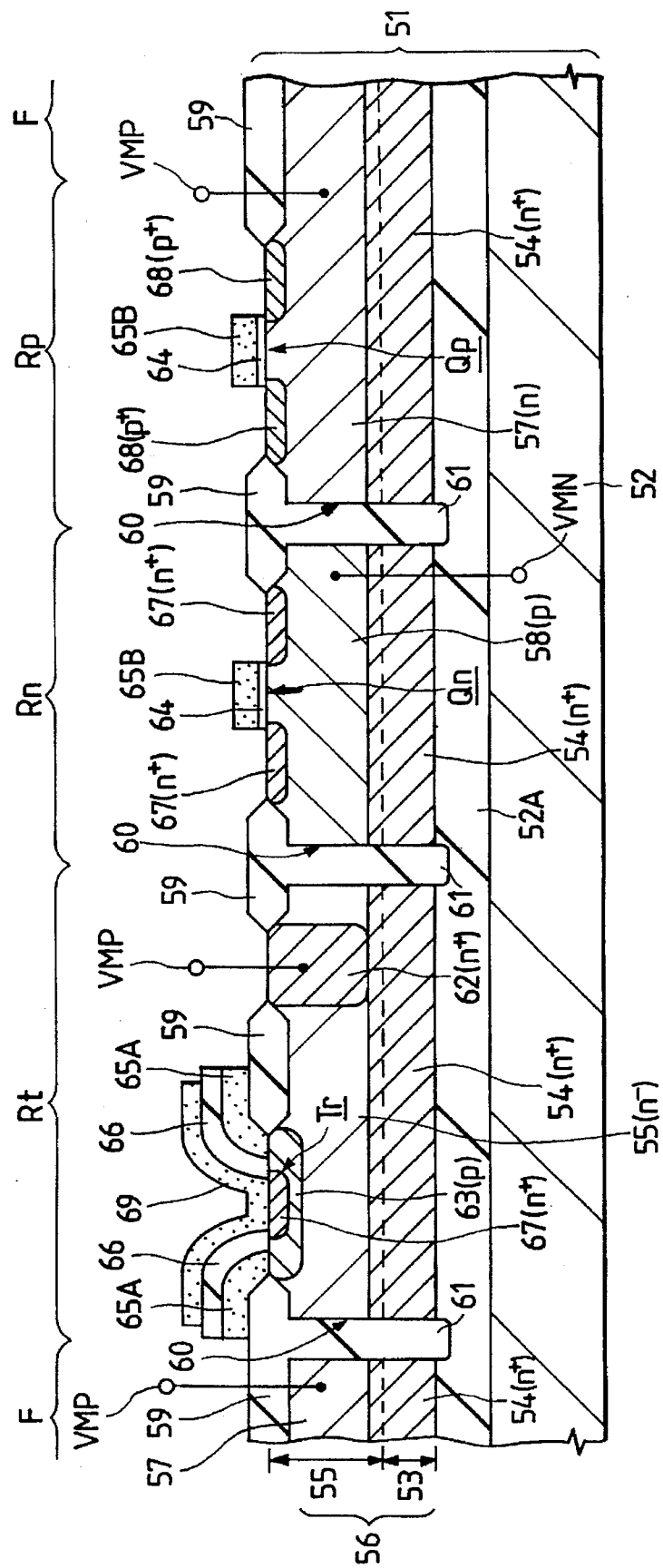
FIG. 19 is a section showing an essential portion of a semiconductor substrate of a semiconductor integrated circuit device according to Embodiment 4 of the present invention.

A schematic construction of the semiconductor integrated circuit device according to Embodiment 4 of the present invention is shown in FIG. 19 (presenting an essential portion in section).

As shown in FIG. 19, the semiconductor integrated circuit device is constructed mainly of the semiconductor substrate 51 having the SOI structure. In this semiconductor substrate 51, the bipoplar transistor forming region Rt, the NMOS forming region Rn, the PMOS forming region Rp and the field region F of the n-type silicon single crystal layer 56 are individually isolated, as in the foregoing Embodiment 3, from one another by the separating groove 60 extending from the main surface of the n-type silicon single crystal layer 56 to the insulating layer 52A. The npn type bipolar transistor Tr is constructed in the region Rt; the n-channel MISFET Qn is constructed in the NMOS forming region Rn; and the p-channel MISFET Qp is constructed in the PMOS forming region Rp.

The NMOS forming region Rn has its p-type well region 58 set, for example, to the lowest fixed potential VMN (e.g., −5.2 [V]) of the external supply voltages. The PMOS forming region Rp is set, for example, to the highest fixed potential VMP (e.g., 0 [V]) of the external supply voltages. The field region F is set, for example, to the highest fixed potential VMP (e.g., 0 [V]) of the external supply voltages.

Thus, the PMOS forming region Rp and the field region F are set to the common fixed potential VMP. As a result, even if the manufacture process should be encountered by the isolation failure in which the separating groove 60 for isolating the PMOS forming region Rp and the field region F fails to reach the insulating layer 52A, the leakage current can be prevented from flowing between the PMOS forming region Rp and the field region F. As a result, the p-channel MISFET Qp enclosed by the defective separating groove 60 can be used as the normal one to enhance the production yield of the semiconductor integrated circuit device as in the foregoing embodiment 1.

By setting the PMOS forming region Rp and the field region F at the common fixed potential VMP, moreover, the separating groove 60 for insulating the PMOS forming region Rp and the field region F can be eliminated, as shown in FIG. 19, to enhance the degree of integration of the semiconductor integrated circuit device in an extent corresponding to the area which might otherwise be occupied by that separating region 60. Since the separating groove 60 can be omitted, still moreover, the production yield of the semiconductor integrated circuit device can be enhanced to an extent corresponding to the omission of the separating groove 60.

Embodiment 5

Figure 20:
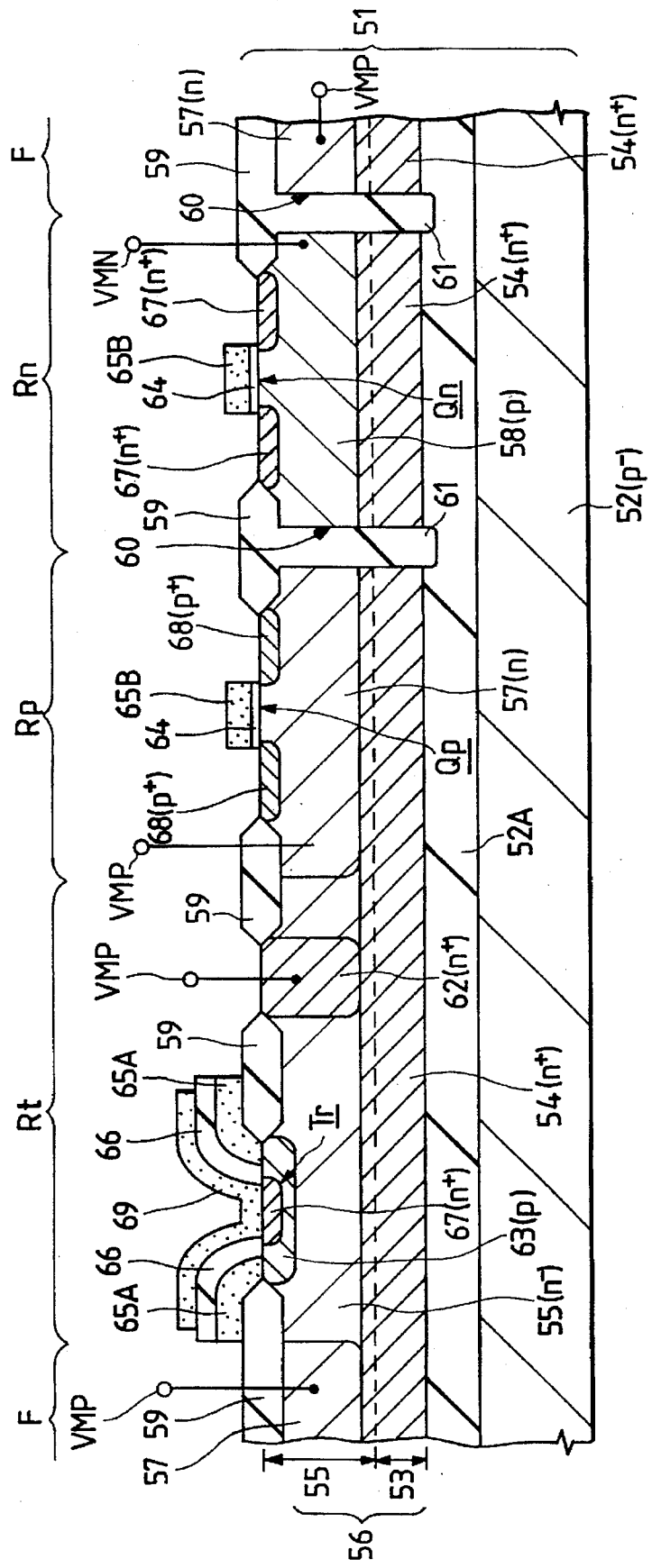
FIG. 20 is a section showing an essential portion of a semiconductor substrate of a semiconductor integrated circuit device according to Embodiment 5 of the present invention.

The schematic construction of the semiconductor integrated circuit device according to Embodiment 5 of the present invention is shown in FIG. 20 (presenting an essential portion in section).

As shown in FIG. 20, the semiconductor integrated circuit device is constructed mainly of the semiconductor substrate 51 having the SOI structure. In the n-type silicon single crystal layer 56 of the semiconductor substrate 51, the n-type well region 57 and the field region F of the PMOS forming region are set to the fixed potential as in the foregoing Embodiment 4.

Figure 21:
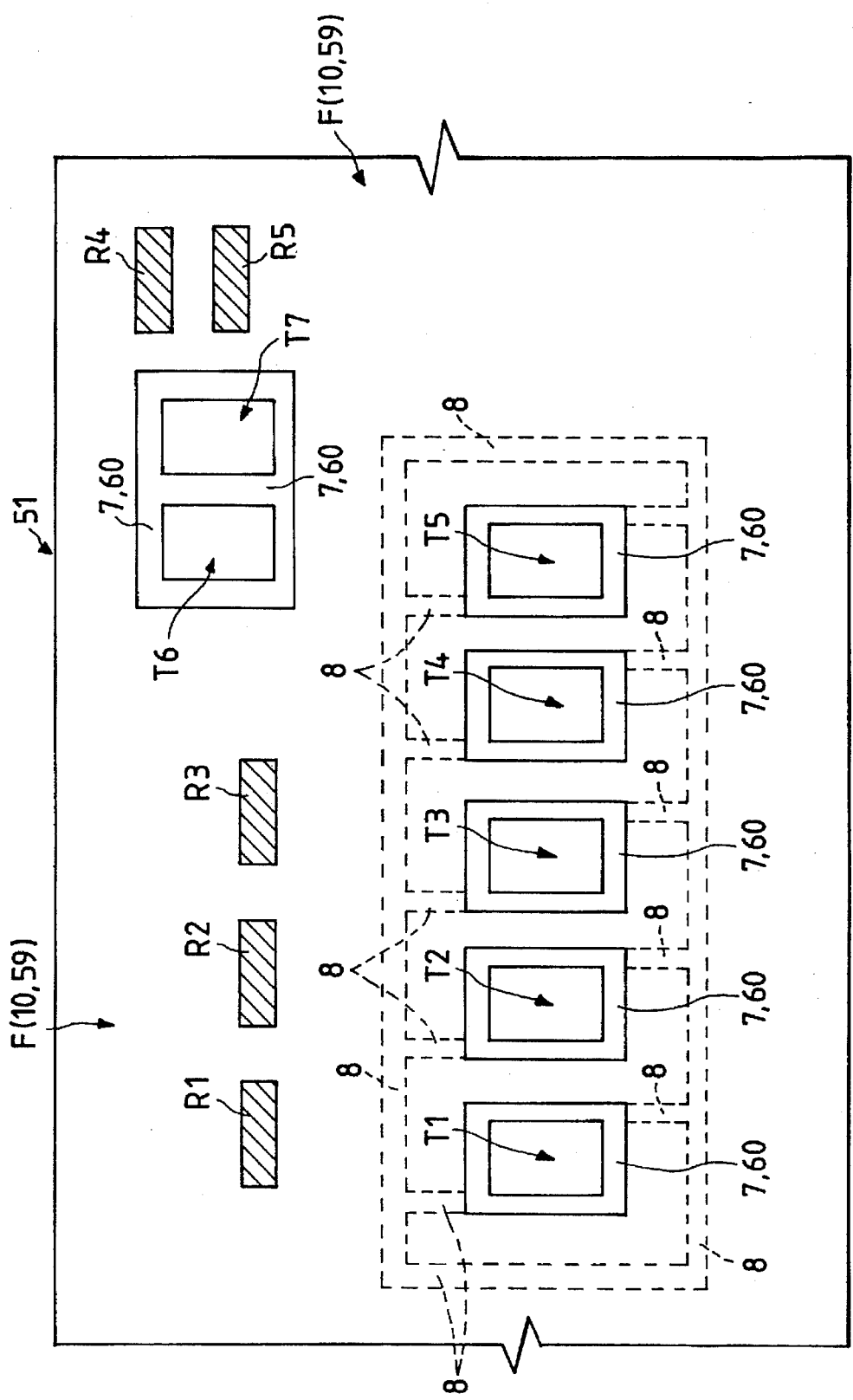
FIG. 21 is a top plan layout view showing a semiconductor integrated circuit device according to Embodiment 6 of the present invention.

Thus, by setting the bipolar transistor forming region Rt, the PMOS forming region Rp and the field region F to the common fixed potential VMP, as shown in FIG. 21, not only the separating groove 60 for isolating the forming region Rt and the PMOS forming region Rp but also the separating groove 60 for isolating the forming region Rt and the field region F can be eliminated to further enhance the degree of integration of the semiconductor integrated circuit device. Moreover, the production yield of the semiconductor integrated circuit device can be further enhanced.

Embodiment 6

A schematic construction of the semiconductor integrated circuit device according to Embodiment 6 of the present invention is shown in FIG. 21 (presenting the layout of an essential portion in a top plan view).

Figure 22:
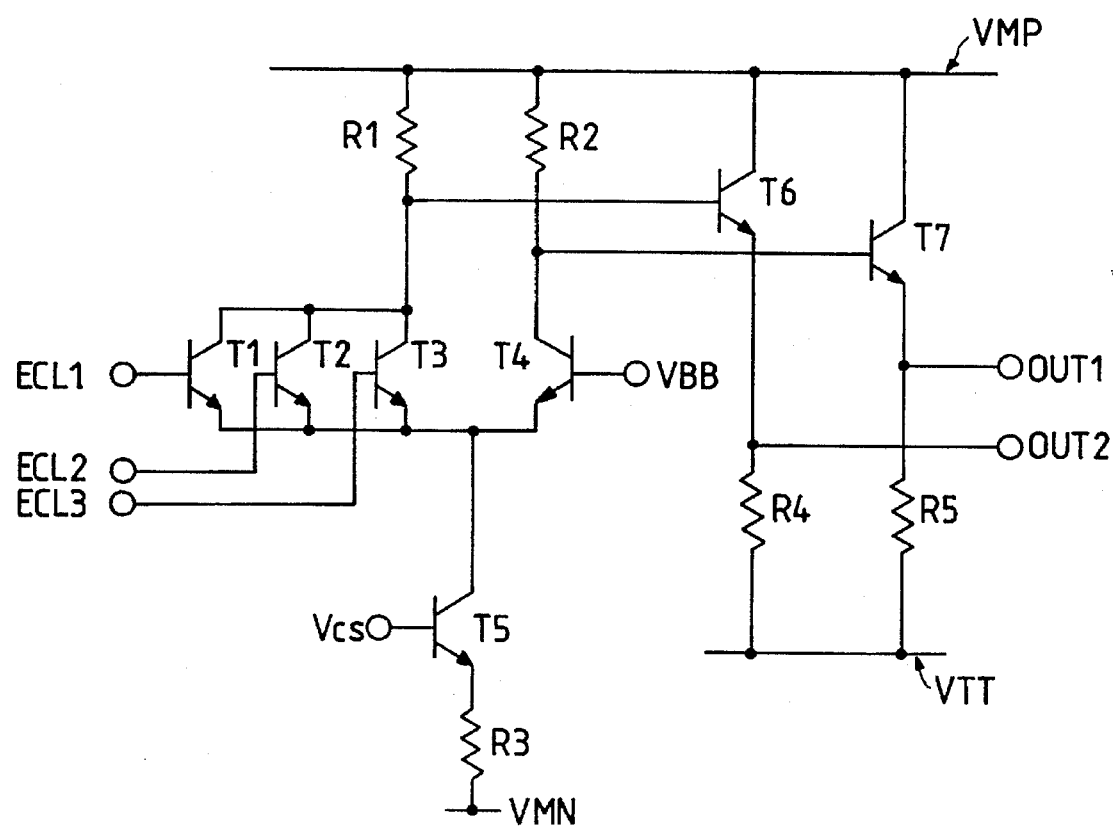
FIG. 22 is a circuit diagram showing an essential portion of a ECL circuit which is made by using the transistors and resistors shown in FIG. 21.

As shown in FIG. 21, the semiconductor substrate 51 is formed over its main surface with bipolar transistors T1 to T7. Each of these bipolar transistors T1 to T7 is surrounded by the first separating groove 7 or 60, as exemplified in the foregoing Embodiments 1 to 5. Of those bipolar transistors T1 to T7, the bipolar transistors T1 to T5 are further surrounded by the second separating grooves 8. On the other hand, the remaining bipolar transistors T6 and T7 are surrounded by the first separating grooves 7 or 60 only. Moreover, the field oxide film 10 or 59 formed in the field region F over the main surface of the semiconductor substrate 51 is formed thereover with resistance elements R1 to R5 made of a polycrystalline silicon film. Although not shown in FIG. 21, the silicon layer 56 of the field region F is fed with the highest fixed potential VMP, as exemplified in the foregoing Embodiments 3 to 5. The present Embodiment 6 is characterized by forming the two kinds of bipolar transistors, that is, the bipolar transistors enclosed by the first and second separating grooves, and the bipolar transistors enclosed by the first separating grooves only. Here will be described the advantages to be attained in case an ECL circuit, as shown in FIG. 22, is constructed of those two kinds of bipolar transistors. The ECL circuit, as shown in FIG. 22, is constructed by connecting the bipolar transistors T1 to T7 and the resistance elements R1 to R5, as shown an FIG. 21, by the ordinary Al wiring technique or the like. The bipolar transistors T1 to T3 for receiving input signals ECL1, ECL2 and ECL3 at the ECL level, the bipolar transistor T4 for receiving a reference voltage VBB, and the bipolar transistor T5 for constituting a constant current source are surrounded by the first and second separating grooves, whereas the emitter-follower transistors T6 and T7 connected with outputs OUT1 and OUT2 are surrounded by the first separating grooves only. The emitter-follower transistors T6 and T7 have their individual collectors connected with the highest potential VMP (e.g., 0 [V]) of the circuit, and the field region F is fixed in advance at the same potential as the collector potential VMP of the emitter-follower transistors T6 and T7. As a result, even if the first separating grooves 7 or 60 should become defective so that they are electrically shorted to the field region F, the emitter-follower transistors T6 and T7 will not become defective. Moreover, the bipolar transistors T6 and T7 can be more highly integrated because they need not be formed with the first separating grooves 7 or 60. On the other hand, the bipolar transistors T1 to T5 constituting the differential amplifier have their collector potential made different from the potential VMP by the resistors R1 to R3. As a result, a probability of failure rises in the case of enclosures of only the first separating grooves. Therefore, the bipolar transistors T1 to T5 other than the emitter-follower transistors T6 and T7 are additionally enclosed by the second separating grooves. Incidentally, a potential VTT is an intermediate one between the potentials VMP and VMN and is set to −2.5 [V] to −3 [V], for example.

Thus, the present Embodiment 6 is enabled to improve the electric reliability by the double separating grooves and to have a high degree of integration either by surrounding the emitter-follower transistors sharing 40 to 50% of the circuit by the single separating grooves or by eliminating the separating grooves. As described above, moreover, the emitter-follower transistors T6 and T7 need not be enclosed by the separating grooves but may more preferably be surrounded by the first separating grooves, because one transistors surrounded by the separating groove is designed as one cell in the layout. In case the characteristics are considered with the single transistor, moreover, it is more preferable to form the first separating grooves because the simulation design is easier for the equal parasitic capacity or the like.

What is claimed is:

1. A semiconductor integrated circuit device comprising:

a substrate having a first insulating layer and a first semiconductor layer of a first conductivity type formed on said first insulating layer;

a field insulating film selectively formed on a surface of said first semiconductor layer so as to surround a first selected area and a second selected area of said surface of said first semiconductor layer, said first and second selected surface areas being spaced from each other in a plane view;

a first groove formed in said first semiconductor layer so as to surround said first selected surface area in said plane view, said first groove extending from said field insulating film to said first insulating layer;

a second groove formed in said first semiconductor layer so as to surround said second selected surface area in said plane view, said second groove extending from said field insulating layer to said first insulating layer, said first and second grooves being spaced from each other in said plane view;

a third groove formed in said first semiconductor layer so as to at least partially surround said first groove in said plane view, said third groove extending from said field insulating layer to said first insulating layer and surrounding a third selected area of said surface of said first semiconductor layer in said plane view, said third selected area being outside said first selected area and being an inactive area in which an active semiconductor element is not formed;

a first active semiconductor element formed in said first semiconductor layer in said first selected area; and a second active semiconductor element formed in said first semiconductor layer in said second selected area.

2. A semiconductor integrated circuit device according to claim 1, wherein said third groove completely surrounds said first groove in said plane view.

3. A semiconductor integrated circuit device according to claim 2, wherein insulating materials are buried in said first to third grooves, respectively.

4. A semiconductor integrated circuit device according to claim 2, wherein each of said first and second active elements includes a bipolar transistor having a collector region of said first conductivity type, a base region of a second conductivity type, opposite to said first conductivity type, formed in said collector region, and emitter region of said first conductivity type formed in said base region, and wherein said first semiconductor layer in said first selected area is used as said collector region of said bipolar transistor of said first active element, and said first semiconductor layer in said second selected area is used as said collector region of said bipolar transistor of said second active element.

5. A semiconductor integrated circuit device according to claim 4, wherein said bipolar transistor formed in said second selected area is an emitter follower transistor and said bipolar transistor formed in said first selected area is an input transistor for receiving input signals, wherein a fixed potential is commonly provided to said first semiconductor layer in said second selected area used as said collector region of said emitter follower transistor and said first semiconductor layer outside both said second and third grooves, and wherein a predetermined potential which is different from said fixed potential is provided to said first semiconductor layer in said first selected area used as said collector region of said input transistor.

6. A semiconductor integrated circuit device according to claim 1, wherein the second selected area is surrounded only by the second groove, and no other groove.

7. A semiconductor integrated circuit device according to claim 6, further comprising at least one fourth selected surface area formed in the substrate, wherein a circuit element is formed in said fourth selected area to cooperate with at least one of the active semiconductor elements in at least one of the first and second selected surface areas, and wherein the fourth selected surface area is not surrounded by any groove.

8. A semiconductor integrated circuit device according to claim 7, wherein said circuit element formed in said fourth selected surface area is a resistor.

9. A semiconductor integrated circuit device comprising:

a semiconductor substrate having a first semiconductor layer of a first conductivity type and a second semiconductor layer of a second conductivity type, opposite to said first conductivity type, formed on said first semiconductor layer, said first and second semiconductor layers forming a PN junction between them;

a field insulating film selectively formed on a surface of said second semiconductor layer so as to surround a first selected area and a second selected area of said surface of said second semiconductor layer, said first and second selected surface areas being spaced from each other in a plane view;

a first groove formed in said semiconductor substrate so as to surround said first selected surface area in said plane view, said first groove extending from said field insulating film to said first semiconductor layer through said second semiconductor layer;

a second groove formed in said semiconductor substrate so as to surround said second selected surface area in said plane view, said second groove extending from said field insulating layer to said first semiconductor layer through said second semiconductor layer, said first and second grooves being spaced from each other in said plane view;

a third groove formed in said semiconductor substrate so as to at least partially surround said first groove in said plane view, said third groove extending from said field insulating layer to said first semiconductor layer through said second semiconductor layer and surrounding a third selected area of said surface of said second semiconductor layer in said plane view, said third selected area being outside said first selected area and being an inactive area in which an active semiconductor element is not formed, each of said first to third grooves crossing said PN junction;

a first active semiconductor element formed in said second semiconductor layer in said first selected area; and a second active semiconductor element formed in said second semiconductor layer in said second selected area.

10. A semiconductor integrated circuit device according to claim 9, wherein said third groove completely surrounds said first groove in said plane view.

11. A semiconductor integrated circuit device according to claim 9, wherein insulating materials are buried in said first to third grooves, respectively.

12. A semiconductor integrated circuit device according to claim 9, wherein each of said first and second active elements includes a bipolar transistor having a collector region of said second conductivity type, a base region of said first conductivity type, formed in said collector region, and an emitter region of said second conductivity type formed in said base region, and wherein said second semiconductor layer in said first selected area is used as said collector region of said bipolar transistor of said first active element, and said second semiconductor layer in said second selected area is used as said collector region of said bipolar transistor of said second active element.

13. A semiconductor integrated circuit device according to claim 12, wherein said bipolar transistor formed in said second selected area is an emitter follower transistor and said bipolar transistor formed in said first selected area is an input transistor for receiving input signals, wherein a fixed potential is commonly provided to said second semiconductor layer in said second selected area used as said collector region of said emitter follower transistor and said first semiconductor layer outside both said second and third grooves, and wherein a predetermined potential which is different from said fixed potential is provided to said second semiconductor layer in said first selected area used as said collector region of said input transistor.

14. A semiconductor integrated circuit device according to claim 9, wherein the second selected area is surrounded only by the second groove, and no other groove.

15. A semiconductor integrated circuit device according to claim 14, further comprising at least one fourth selected surface area formed in the substrate, wherein a circuit element is formed in said fourth selected area to cooperate with at least one of the active semiconductor elements in at least one of the first and second selected surface areas, and wherein the fourth selected surface area is not surrounded by any groove.

16. A semiconductor integrated circuit device according to claim 15, wherein said circuit element formed in said fourth selected surface area is a resistor.

* * * * *